United States Patent [19]

Hoshuyama

[11] Patent Number: 5,627,799

[45] Date of Patent: May 6, 1997

[54] BEAMFORMER USING COEFFICIENT RESTRAINED ADAPTIVE FILTERS FOR DETECTING INTERFERENCE SIGNALS

[75] Inventor: Osamu Hoshuyama, Tokyo, Japan

[73] Assignee: NEC Corporation, Tokyo, Japan

[21] Appl. No.: 523,059

[22] Filed: Sep. 1, 1995

[30] Foreign Application Priority Data

Sep. 1, 1994 [JP] Japan .................................. 6-208635

[51] Int. Cl.$^6$ ..................................................... G01S 15/00
[52] U.S. Cl. ........................ 367/121; 367/901; 367/119; 367/905; 381/94
[58] Field of Search ........................... 367/12, 119, 121, 367/123, 129, 901, 905, 103; 128/661.01; 381/94

[56] References Cited

U.S. PATENT DOCUMENTS 3,763,490  10/1973  Hadley et al. .......................... 342/375
4,956,867   9/1990  Zurek et al. ........................... 381/94.1

OTHER PUBLICATIONS

L. Griffiths et al., "An Alternative Approach to Linearly Constrained Adaptive Beamforming", *IEEE Transactions on Antennas and Propagation*, vol. AP-30, No. 1, Jan. 1982, pp. 27–34.

S. Nordholm et al., "The Board–Band Wiener Solution for Griffiths–Jim Beamformers", *IEEE Transactions on Signal Processing*, vol. 40, No. 2, Feb. 1992, pp. 474–479.

I. Claesson et al., "A Spatial Filtering Approach to Robust Adaptive Beaming", *IEEE Transactions on Antennas and Propagation*, vol. 40, No. 9, Sep. 1992, pp. 1093–1096.

"Processing Signals Carried By Propagating Waves", *Multidimensional Digital Signal Processing*, Prentice–Hall, Inc., pp. 289–315.

M.M. Goodwin et al., "Constant Beamwidth Beamforming", *Proceedings of International Conference on Acoustics, Speech and Signal Processing 93*, pp. I–169–I–172.

*Primary Examiner*—Ian J. Lobo
*Attorney, Agent, or Firm*—Sughrue, Mion, Zinn, Macpeak & Seas

[57] ABSTRACT

In an adaptive array beamformer, a spatial beamforming filter is connected to a sensor array for respectively filtering and summing array signals to produce a first filter output containing a target signal that arrives in a specified direction. First adaptive filters provide transversal-filtering the first filter output to produce a second filter output not containing the target signal, using a first error signal by restraining their tap weight coefficients. The array signals are further coupled to subtractors. Each subtractor detects a difference between the second filter output of the corresponding first adaptive filter and the corresponding sensor signal to derive the first error signal. Second adaptive filters provide transversal-filtering the first error signals of the subtractors to produce third filter outputs, using a second error signal, by restraining their tap weight coefficients. The third filter outputs are summed and subtracted from the first filter output to produce an output of the beamformer, which is supplied as the second error signal to the second adaptive filters

10 Claims, 11 Drawing Sheets

LAF = Leaky Adaptive Filter

NCAF = Norm-Constrained Adaptive Filter

CCAF = Coefficient-Constrained Adaptive Filter

CCAF = Coefficient-Constrained Adaptive Filter
NCAF = Norm-Constrained Adaptive Filter

BEAMFORMER USING COEFFICIENT RESTRAINED ADAPTIVE FILTERS FOR DETECTING INTERFERENCE SIGNALS

BACKGROUND OF THE INVENTION

1. Field of the Invention

The present invention relates generally to interference cancelers, and more particularly to a generalized sidelobe canceler, or adaptive beamformer for an array of sensors such as microphones and the like.

2. Description of the Related Art

It is known that wideband signals propagating across an array of sensors in directions that are different than the beam steering direction of the array suffer a distortion that is similar to lowpass filtering.

According to a prior art microphone array, signals detected by an array of microphones are lowpass filtered and summed together to detect a target signal that arrives in a particular direction. The adaptive microphone array beamformer is one form of the generalized sidelobe canceler as described in an article "An alternative Approach to Linearly Constrained Adaptive Beamforming", Lloyd J. Griffiths and Charles W. Jim, the IEEE Transactions on Antenna and Propagation, Vol. AP-30, No. 1, January 1982, pages 27–34. As described in an article "The Broad-Band Wiener Solution for Griffiths-Jim Beamformers", S. Nordholm, I. Claesson and P. Eriksson, the IEEE Transactions on signal Processing, Vol. 40, No. 2, February 1992, pages 474–478 (hereinafter referred to as Document 1), the generalized sidelobe canceler comprises, a spatial lowpass filter connected to an array of microphones for filtering signals from the array and summing the filtered signals so that only the desired signal is contained in the summed signal. A plurality of spatial highpass filters are provided to form a spatial highpass filter bank. Each spatial highpass filer is connected to a selected pair of microphones for filtering and summing the sensor signals to detect the interference signals. A plurality of adaptive filters are provided for using the interference signals as reference signals to detect those components having high correlation with the interference signals contained in the detected target signal.

Since the spatial highpass filters of Document 1 are of nonadaptive type and each uses two microphone outputs, the range of signals which must be rejected is very narrow. As a result, a slight departure from the intended direction causes a leakage of the desired signal into the interference path of the beamformer.

To overcome the prior art shortcoming, a proposal has been made to implement a spatial highpass filter for receiving more than two microphone outputs as described in an article "A Spatial Filtering Approach to Robust Adaptive Beaming", I. Claesson et al, the IEEE Transactions on Antennas and Propagation, Vol. 40, No. 9, September 1992, pages 1093 to 1096 (hereinafter referred to as Document 2). According to Document 2, each of the highpass filters that comprise the spatial highpass filter broadens the range of arrival angles by receiving multiple spatial samples from a selected set of microphone outputs using a plurality of leaky adaptive filters.

However, a large number of microphones (the Q value) are required to implement a beamformer having a wide range of rejection angles, for each group of spatial highpass filters in the filter bank. If a sufficient number of microphones is not provided, the degree of design freedom must be sacrificed, resulting in a beamformer having a low noise canceling capability. The difference between the assumed direction and the actual arrival direction of the target signal, or a look-direction error, is of another concern because it degrades the target signal, or a look-direction error, is of another concern because it degrades the target signal. In order to compensate for this shortcoming, the spatial highpass filter bank of the prior art needs as many spatial highpass filters as is necessary to provide a wide range of angles to reject the target signal to prevent its leakage into the interference path of the beamformer.

SUMMARY OF THE INVENTION

It is therefore an object of the present invention to provide an adaptive array beamformer with a reduced number of sensors while allowing a look-direction error.

According to the present invention, there is provided an adaptive array beamformer comprising an array of spatially distributed sensors, and a spatial beamforming filter connected to the sensors for respectively filtering output signals of the sensors and summing the filtered output signals to produce a first filter output containing a target signal arriving at the array in a specified direction. A plurality of first adaptive filters are provided, each having a tapped-delay line connected to receive the first filter output, a coefficient update circuit for producing tap weight coefficients indicating correlations between tap signals from the tapped-delay line and a first error signal applied thereto, a plurality of multipliers for weighting the tap signals with the coefficients, respectively, and means for summing the weighted tap signals to produce a second filter output not containing the target signal. The coefficient update means includes restraining means for preventing the coefficients from increasing indefinitely. A plurality of first subtractors are provided, each detecting a difference between a corresponding sensor signal and the second filter output of the corresponding first adaptive filter and supplying the difference to the coefficient update circuit of the corresponding first adaptive filter as the first error signal. A plurality of second adaptive filters are provided, each having a tapped-delay line connected to receive the error signal from a corresponding one of the first subtractors, a coefficient update circuit for producing tap weight coefficients indicating correlations between tap signals from the tapped-delay line and a second error signal applied thereto, a multiply-and-sum circuit for weighting the tap signals with the coefficients respectively and summing the weighted tap signals to produce a third filter output. The coefficient update circuit includes restraining means for preventing the coefficients from increasing indefinitely. An adder is provided for summing the third filter outputs from the second adaptive filters. A second subtractor detects a difference between the first filter output and the output of the adder and supplying the difference to the coefficient update circuit of the second adaptive filters as the second error signal.

In a preferred embodiment, a second spatial beamforming filter is connected to the sensors for respectively filtering output signals of the sensors and summing the filtered output signals to produce a second filter output containing the target signal, the second spatial beamforming filter having a greater beam width than a beam width of the first spatial beamforming filter. The first adaptive filters are connected to the output of the second spatial beamforming filter, instead of to the output of the first-named spatial beamforming filter.

BRIEF DESCRIPTION OF THE DRAWINGS

The present invention will be described in further detail with reference to the accompanying drawings, in which.

DETAILED DESCRIPTION

Figure 1:
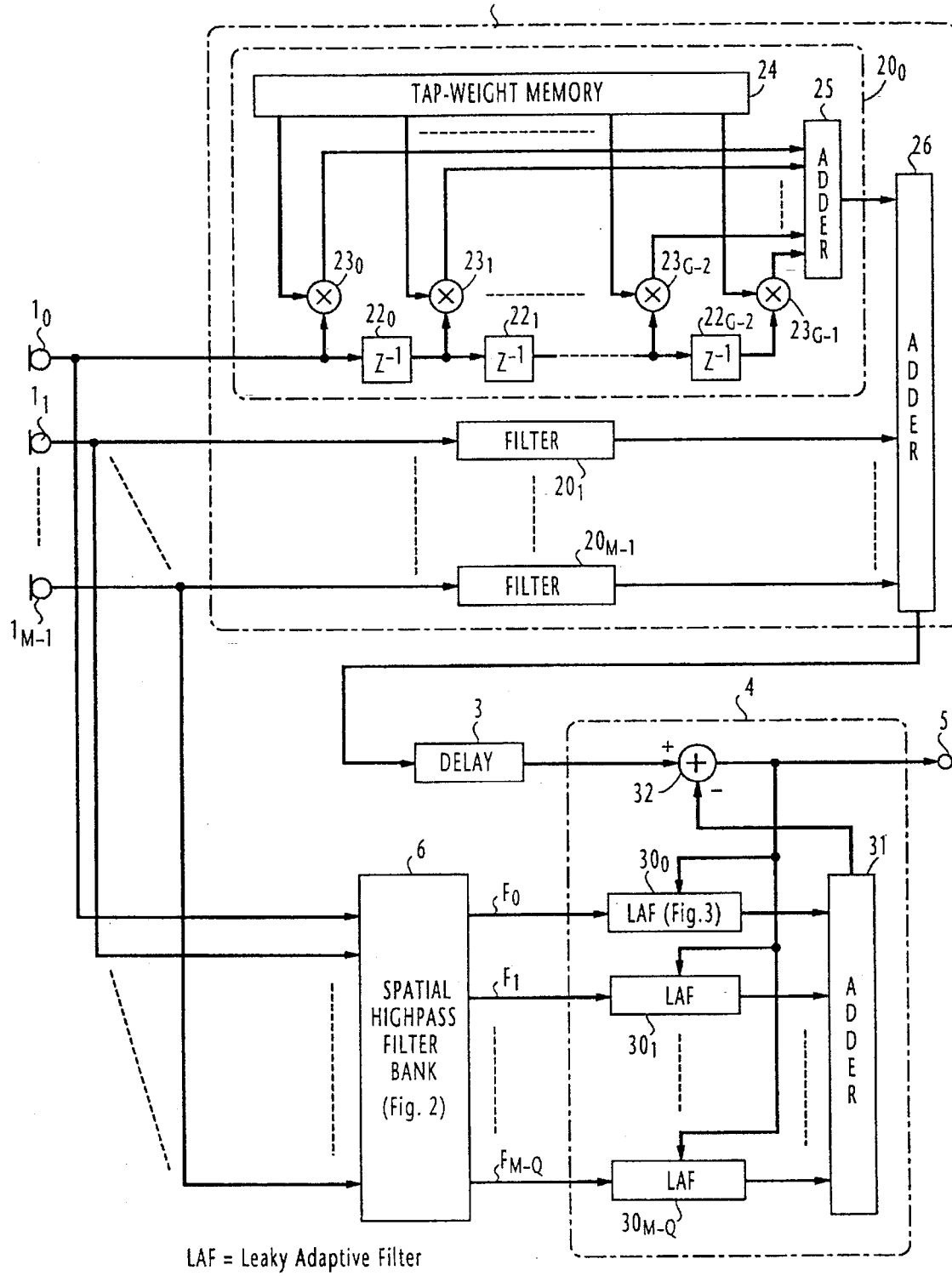
FIG. 1 is a block diagram of a prior art adaptive array beamformer.
Figure 2:
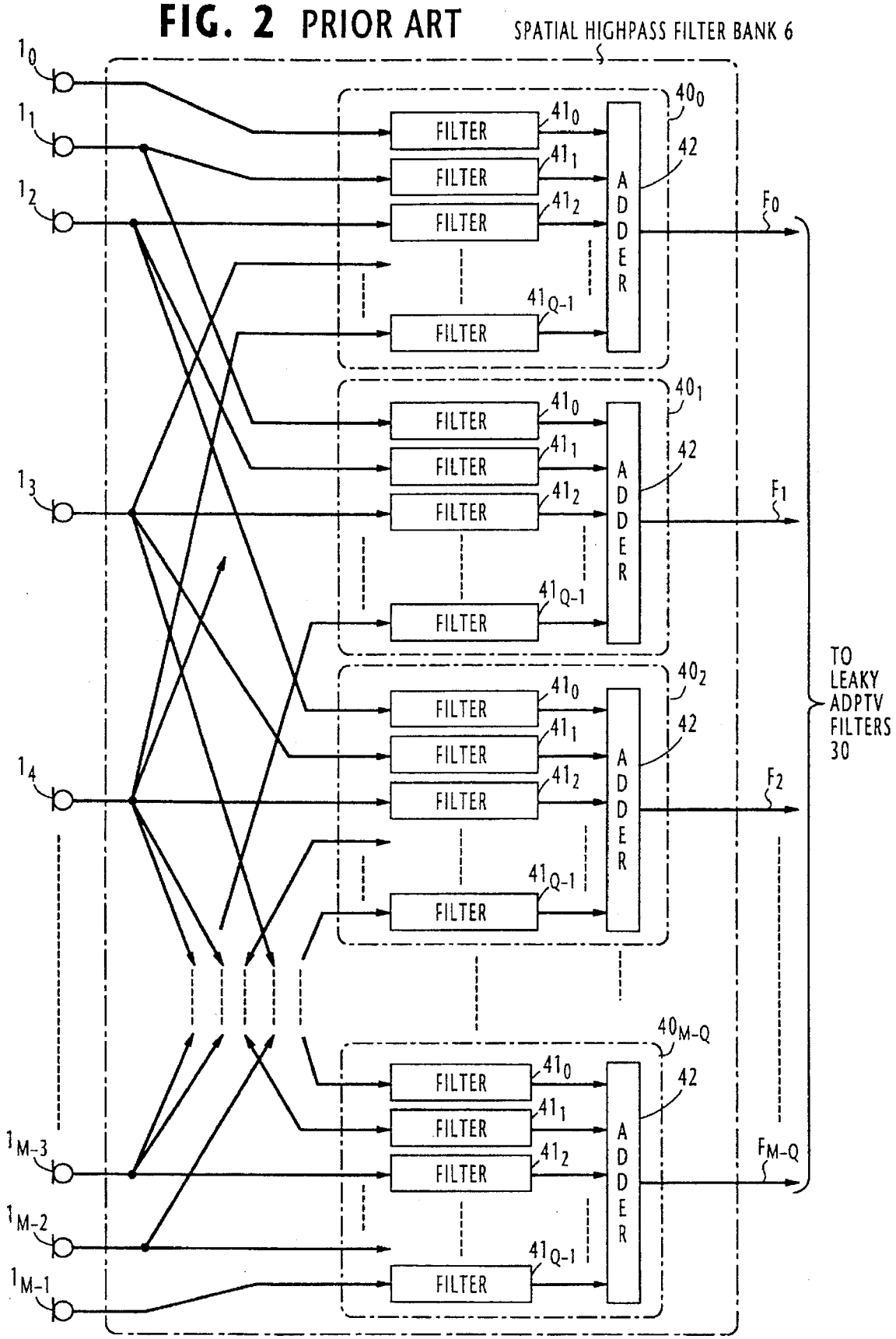
FIG. 2 is a block diagram of the spatial highpass filter of the FIG. 1 prior art.
Figure 3:
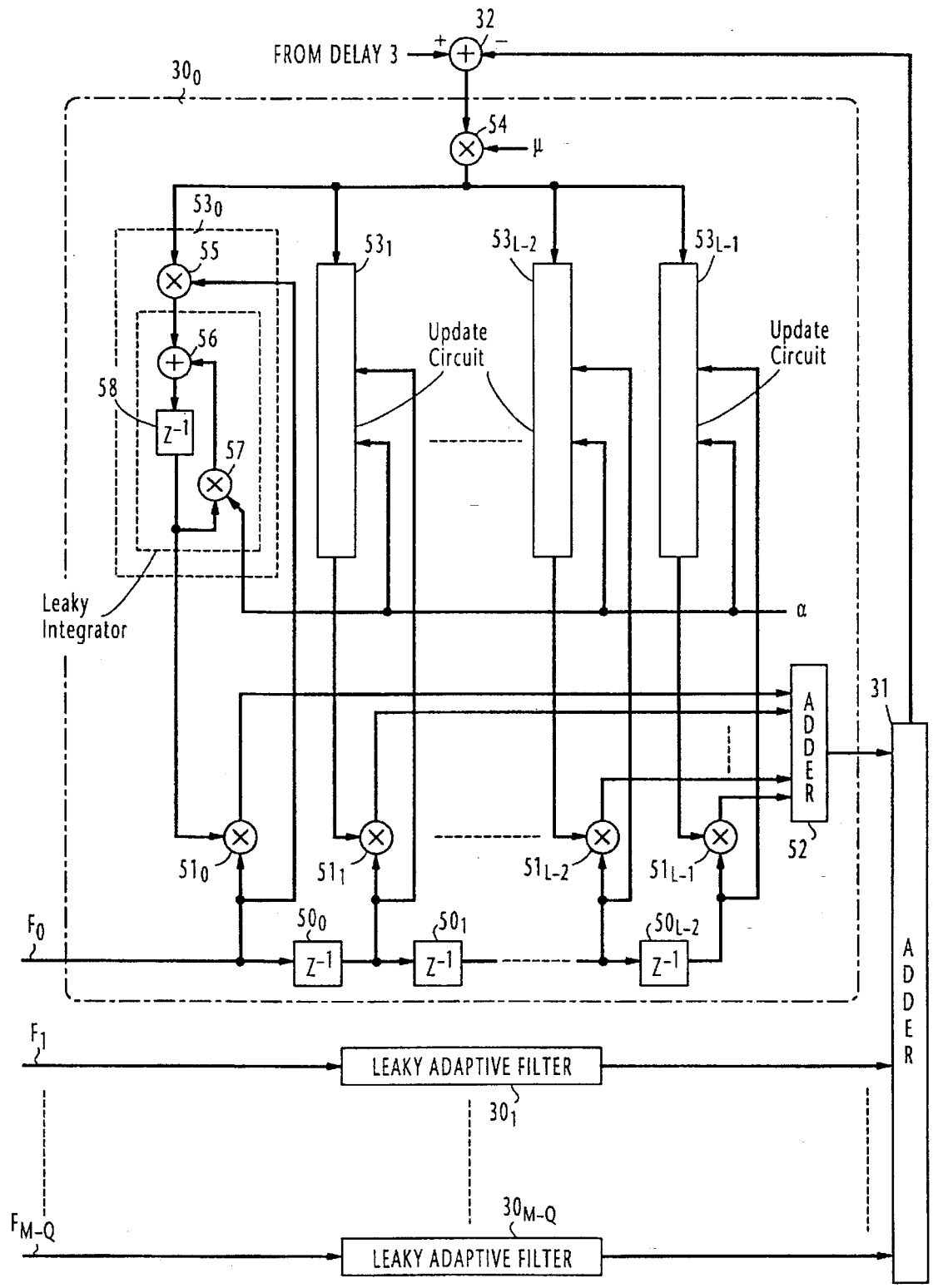
FIG. 3 is a block diagram of the leaky adaptive filters of the FIG. 1 prior art.

Before proceeding with the detailed description of the present invention, it may provide helpful to provide an explanation of the prior art with reference to FIGS. 1 to 3. In FIG. 1, a linear array of microphones $1_0$~$1_{M-1}$ of identical operating characteristics are located at sufficient distances from signal sources of interest so that the wavefront of each signal at the microphones is considered to be linear. The microphones are connected to FIR transversal filters $20_0$~$20_{M-1}$ of a spatial lowpass filter 2, the outputs of the filters 20 being summed by an adder 26 to produce an output containing the target signal from a particular (assumed) direction and signals from other directions which are uncorrelated with the target signal. The outputs of filters 20 are applied through a timing adjustment delay circuit 3 to a subtractor 32 of a canceler 4.

The outputs of the M microphones are further connected to a spatial highpass filter bank 6 to produce (M–Q–1) output signals. The filter bank 6 operates so that the signals including the target signal as well as signals in the neighborhood of the assumed direction are rejected. The outputs of the filter bank 6 thus contain the undesired signals as dominant components. The outputs of filter bank 6 are fed through leads $F_0$~$F_{M-Q}$ to leaky adaptive filters $30_0$~$30_{M-Q}$ of the canceler 4. Leaky adaptive filters 30 of the canceler detect undesired signals contained in the output signal of the beamformer at terminal 5 having a high correlation with the undesired signals detected by the spatial highpass filter 6 by adaptively updating their tap weight values using the output of the beamformer as a signal indicating the amount of correction error. The high correlation signals detected by the leaky adaptive filters 30 are combined by an adder 31 and fed to the subtractor 32 where it is subtracted from the time-coincident signal from spatial lowpass filter 2, whereby the undesired signals are canceled at the output terminal 5 of the beamformer.

Each of the filters 20 has a tapped delay line formed by delay elements $22_0$~$22_{G-2}$ forming (G–1) delay-line taps which are connected to corresponding tap weight multipliers 23 for respectively weighting the tap signals with particular tap weight coefficients supplied from a tap weight memory 24 (where G is equal to or greater than 2), the weighted tap signals being summed by an adder 25 and fed to the adder 26. The tap weight memory 24 of each filter 20 stores a set of tap weight coefficients whose values are determined so that filters 20 exhibit particular characteristics which result in an output containing the target signal. If the assumed direction is normal to the length of the microphone array, the integer G=2 is used and the tap weight coefficient of the multiplier $23_0$ is set equal to "1". Other design approaches are described in "Multidimensional Digital Signal Processing", Prentice-Hall, Inc. pages 289–315, 1984 and IEEE, Proceedings of International Conference on Acoustics, Speech and Signal Processing 93, pages 169–172.

Spatial highpass filter bank 6 of the type described in Document 2 is shown in FIG. 2. Filter bank 6 is made up of (M–Q–1) groups 40 of Q highpass filters 41 each, and an adder 42, which each group forming a spatial highpass filter, where Q is equal to or greater than "3". Each spatial filter 40 receives a selected set of the microphone outputs such that the signals from the microphones positioned closer to the center of the array are coupled to an increasing number of filters 41. Thus, the signals incident on the center area of the microphone array fare filtered through a greater number of filters 41 than the signals incident on the edges of the array are. Highpass filters 41 are basically of the same transversal filter configuration as the filters 20, but with different delay line lengths (G) and different filter characteristics.

The characteristics of the highpass filters 41 of filter bank 6 are those of a rejection filter wherein a group of signals propagating in the assumed direction are rejected at the output of adder 42 of each spatial highpass filter 40. A basic design method for this type of spatial filter is described in Document 2. One important consideration is the degree of design freedom which is determined by the number of microphones used. For an M-microphone array, it is represented by M–Q+1. With the use of a large number of microphones a beamformer having a wide rejection angle with high attenuation can be implemented. Advantageously, the target signal can be rejected in the interference path of such beamformers even though the assumed direction differs from its actual arrival direction.

In each of the leaky adaptive filters 30 (FIG. 3), a corresponding output signal from the filter bank 5 is successively shifted through delay-line taps formed by delay elements $50_0$~$50_{L-2}$ and the tap signals are weighted respectively by (L–1) multipliers 51 with tap weight coefficients supplied from update circuits $53_0$~$53_{L-1}$ and then summed by adder 52 for coupling to the adder 31. Each update circuit 53 operates in accordance with the least mean square (LMS) algorithm. The output of beamformer from subtractor 32, representing a correction error, is weighted by a stepsize μ in a multiplier 54 and applied to a multiplier 55 of each update circuit 53 for detecting a correlation between the weighted error and a corresponding tap signal. Each update circuit 53 includes a leaky integrator formed by an adder 56, a multiplier 57 and a delay element 58. The correlation output of multiplier 55 is summed with a feedback signal from multiplier 57 and delayed by a symbol interval by delay element 58. The delayed symbol is applied to the corresponding tap weight multiplier 51 as an updated tap weight coefficient as well as to the multiplier 57 where it is scaled down by a factor α (equal to less than unity) and fed back to the adder 56. Because of this scale-down feedback, the integrator operates as a leaky integrator which differs from normal integrators where the scale factor is unity. The leaky integration prevents the tap weight coefficient from growing indefinitely when the target signal, when there is a leakage of the target signal to the interference path (i.e., the outputs of filter bank 6) of the beamformer due to the inherent variability of microphone characteristics and positional errors of the microphones. Otherwise, the interference signals produced by the adaptive filters would become identical to the components of the signal in the main path of the beamformer, and the resulting cancellation would substantially remove the target signal.

However, in order to implement a beamformer having a wide range of rejection angles, a large number of microphones (the Q value) are required for each group of spatial highpass filters in the filter bank. If a sufficient number of microphones is not provided, the degree of design freedom must be sacrificed, resulting in a beamformer having a low noise cancelling capability.

Figure 4:
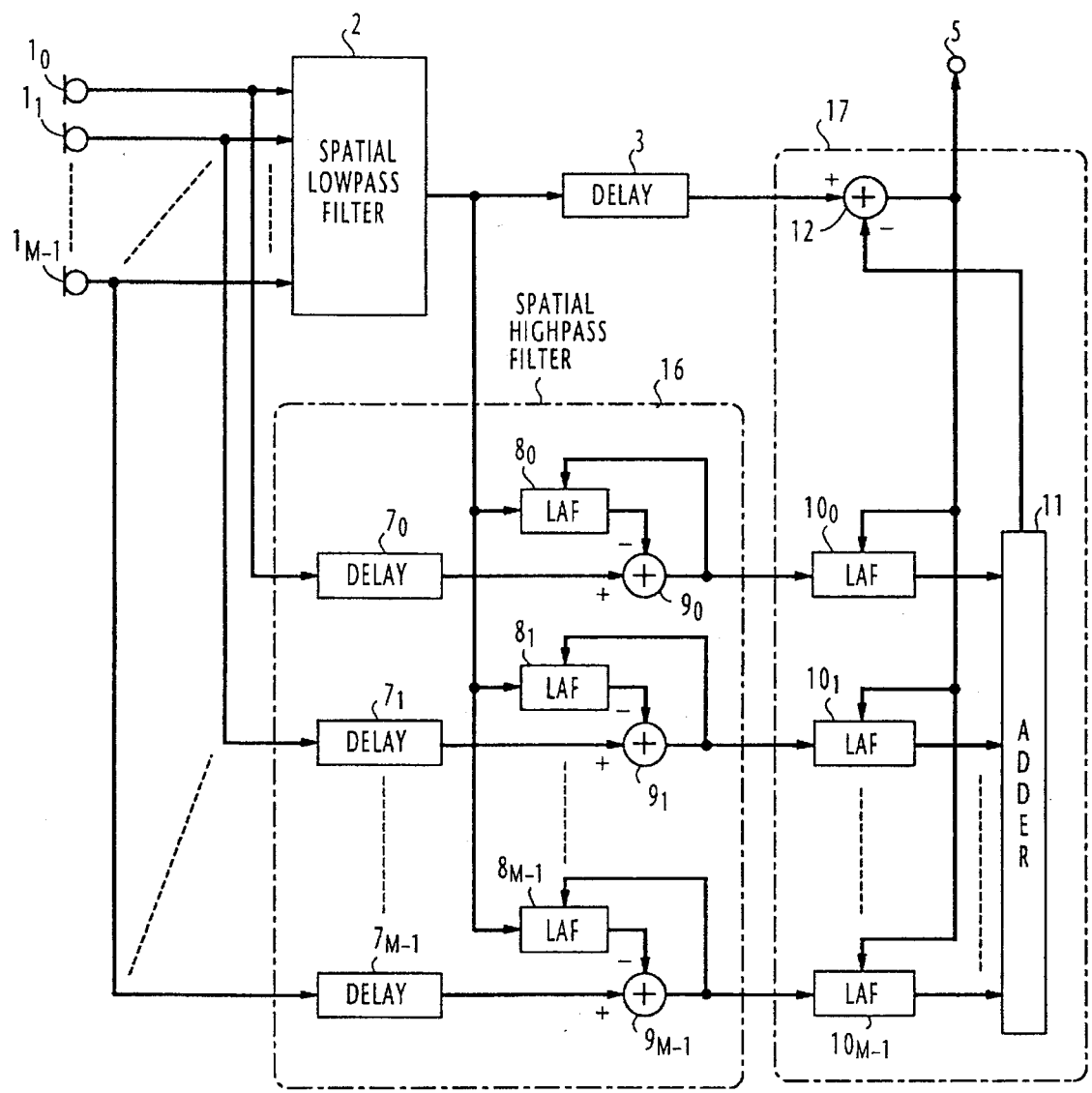
FIG. 4 is a block diagram of an adaptive array beamformer according to a first embodiment of the present invention.

Referring now to FIG. 4, there is shown an adaptive array beamformer according to a first embodiment of the present invention in which parts corresponding to those of FIG. 1 are marked by the same numerals as those used in FIG. 1, the description thereof being omitted for simplicity. The adaptive array beamformer of this embodiment comprises a spatial highpass filter 16 and a canceler 17. Spatial highpass filters 16 includes M delay circuits $7_0 \sim 7_{M-1}$ connected respectively to the microphones $1_0 \sim 1_{M-1}$, M leaky adaptive filters $8_0 \sim 8_{M-1}$ and M subtractors $9_0 \sim 9_{M-1}$ connected respectively to the outputs of the M delay circuits 7.

The spatial lowpass filter 2, connected to the microphone array, provides spatial lowpass filtering of the individual microphone signals and summing the lowpass-filtered signals in the same manner as in the prior art beamformer to detect the target signal. The output of the spatial lowpass filter 2 is applied to all the leaky adaptive filters 8 as a reference signal as well as to the delay 3. The outputs the microphone array are passed through corresponding delay circuits 7 to subtractors 9 to which the outputs of leaky adaptive filters 8 are also supplied to be subtracted from the corresponding microphone outputs. The output of each subtractor 9 is coupled to the corresponding leaky adaptive filter 8 as an error signal to update their tap weight values. The M delay circuits 7 provide a delay to the microphone outputs so that they are time coincident at the inputs of corresponding subtractors 9 with the output signals of leaky adaptive filters 8.

Each of the leaky adaptive filters 8 is identical in structure to that shown in FIG. 3. Correlations between the reference signal and each of the error signals are detected by the leaky adaptive filters 8. As described previously in connection with the prior art, the strength of a leaky adaptive filter for restraining the growth of tap weight is proportional to the magnitude of the tap weight value itself. As a result, if the optimum value for the tap weight coefficient (which minimizes the error input of the leaky adaptive filter) is relatively large, the tap weight value cannot converge to the optimum value, resulting in a substantial amount of error from the optimum value. This implies that depending on the tap weight value the correlation capability of the leaky adaptive filters 8 differs significantly. Therefore, those signal components, which require a greater tap weight value for enabling their correlation to be detected, cannot sufficiently be removed, while those signals requiring a lower tap weight value can be removed sufficiently.

With respect to the signal arriving in the assumed direction as well as to those arriving in near-assumed directions, the output of spatial lowpass filter 2 contains the same amount of such signal components as those detected by the microphone array, and the maximum tap weight value necessary for removing them from the interference path of the beamformer is as small as "1". The leaky adaptive filters 8 are therefore designed with a low maximum tap weight value so that the target signal components are completely removed at the outputs of subtractors 9.

With respect to the interference signals, on the other hand, the output of the spatial lowpass filter 2 contains a smaller amount of interference signals than those detected by the microphone array. Therefore, the tap weight value necessary for the leaky adaptive filters 8 to remove the interference signals is much higher than "1". Thus, the amount of removal at the outputs of subtractors 9 is much less in the case of the interference signals than in the case of the target signal components. If normal adaptive filters are used instead of the leaky adaptive filters 9, their tap weight values would be allowed to grow indefinitely, and as a result, not only the interference signals but the target signal components are removed.

Canceler 17 includes M leaky adaptive filters $10_0 \sim 10_{M-1}$ connected respectively to the outputs of corresponding subtractors 9 to receive the interference signals detected in a manner just described. Each of the leaky adaptive filters 10 is identical in characteristic to the prior art leaky adaptive filters. Although most of the target signal components are removed, there is still a small amount of their leakage at the outputs of subtractors 9. Due to the adaptive leaky integration of filters 10, the growth of their tap weight values due to the presence of such small amount of leakage of the target signal are restrained. The outputs of leaky adaptive filters 10 are summed by adder 11 and supplied to subtractor 12 for canceling the interference signals contained in the main path of the beamformer.

Since the output of each subtractor 9 contains only a small amount of the target signal, the latter is not canceled in the subtractor 12 even though there is a look-direction error.

the leaky adaptive filters 8 of the spatial highpass filter 16 operate in effect as variable spatial highpass filters. The degree of design freedom of the present embodiment is not less than that of Document 2 and a large look-direction error is allowed using a smaller number of microphones than in the case of Document 2.

Figure 5:
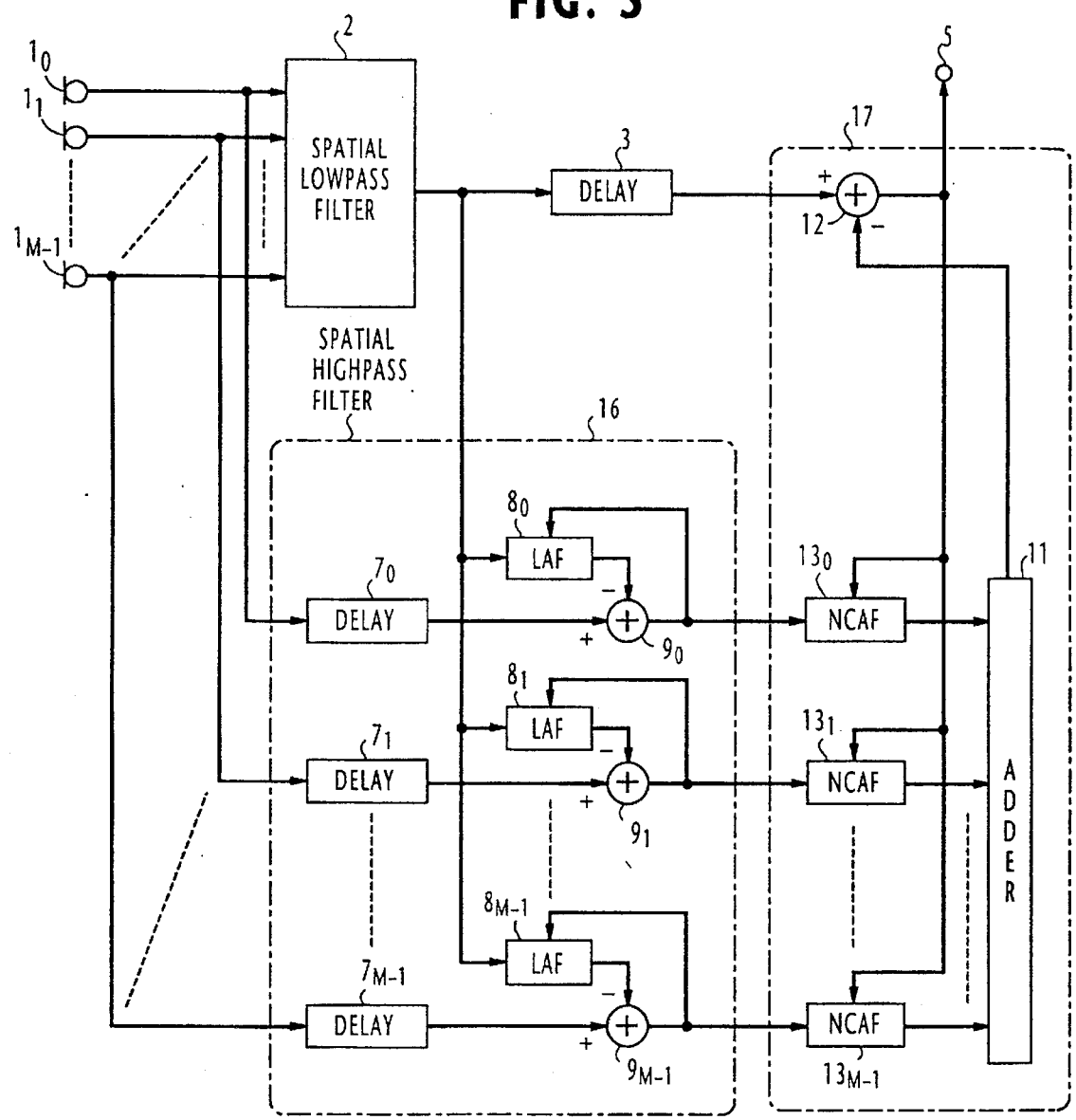
FIG. 5 is a block diagram of an adaptive array beamformer according to a second embodiment of the present invention.

A second embodiment of the present invention is shown in FIG. 5 in which parts corresponding to those in FIG. 4 are marked with the same numeral as those used in FIG. 4. The beamformer of FIG. 5 differs from the first embodiment in that the leaky adaptive filters 10 of FIG. 4 are replaced with norm-constrained adaptive filters $13_0 \sim 13_{M-1}$.

Figure 6:
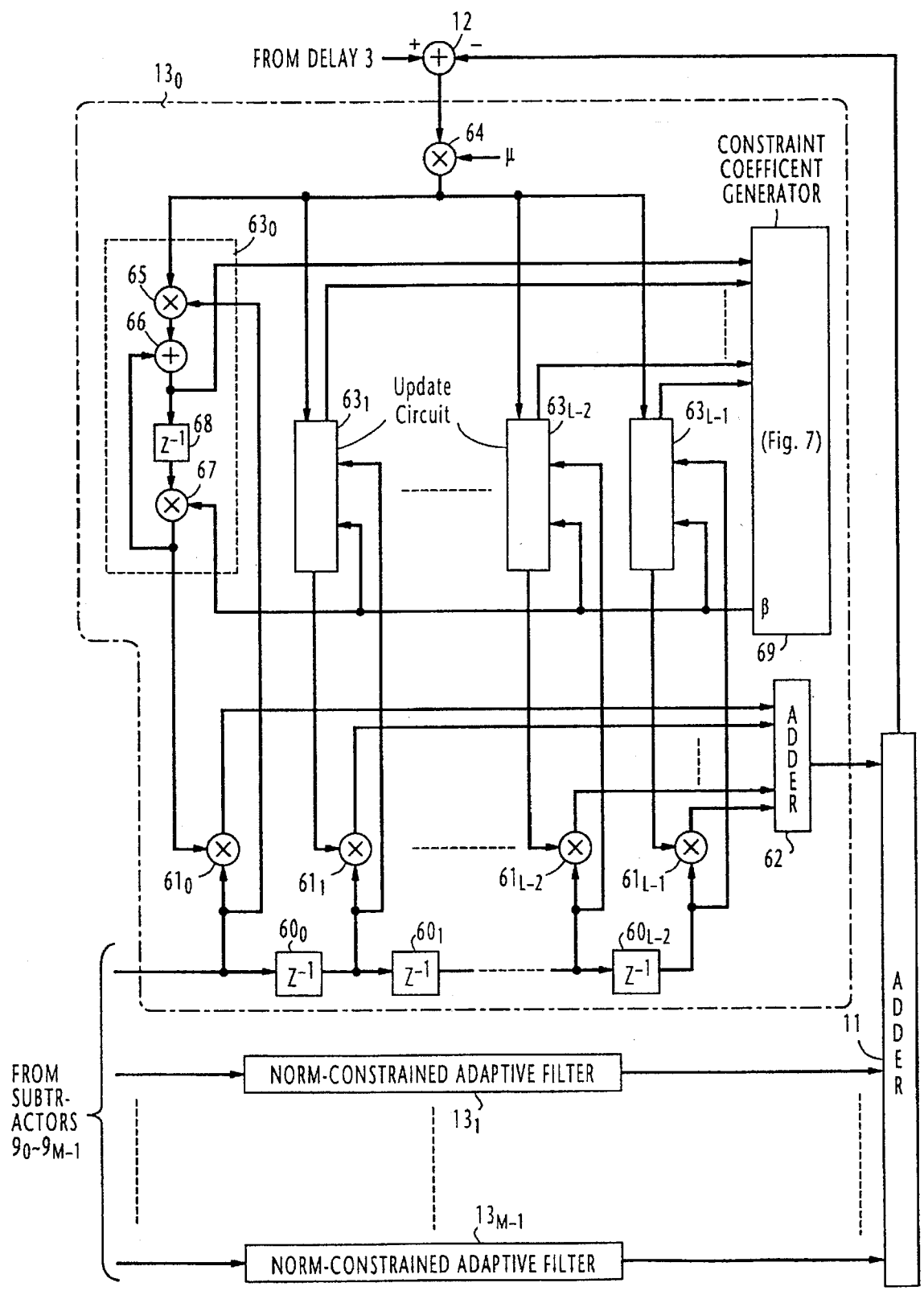
FIG. 6 is a block diagram of the norm constraint adaptive filters of the second embodiment.

As shown in detail in FIG. 6, each norm-constrained adaptive filter 13 comprises a tapped-delay line formed by delay elements $60_0 \sim 60_{L-2}$, tap weight multipliers $61_0 \sim 61_{L-1}$ connected to the delay-line taps, and adder 62 for summing the weighted tap signals. Update circuits $63_0 \sim 63_{L-1}$ are provided which are connected to a constraint coefficient generator 69. Each update circuit 63 receives an error signal from the output of the beamformer from subtractor 12 via multiplier 64 where it weighted by the stepsize μ. Correlation between the corresponding tap signal and the weighted error signal is taken by a multiplier 65 and summed by adder 66 with a tap weight value of a previous sample supplied from multiplier 67. The output of delay element 68 is scaled down by multiplier 67 with a constraint control parameter β from the constraint coefficient generator 69. To the constraint coefficient generator 69 is connected the output of multiplier 65 of each update circuit 63. The output of the adder 66 is supplied to the constraint coefficient generator 69 as the output of the update circuit 63.

Constraint coefficient generator 69 controls the constraint control parameter β such that the p-th power of norm $L_p$ (where p is an integer equal to or greater than unity) of the tap weight coefficients does not exceed a positive integer Θ using the following Equation:

$$L_p = \sqrt[p]{\sum_{i=0}^{L-1} |w_i|^p} \qquad (1)$$

where $w_i$ is the tap weight coefficient at the i-th delay-line tap. By constraining the Lp value below the Θ-value, the growth of tap weights is restrained.

Figure 7:
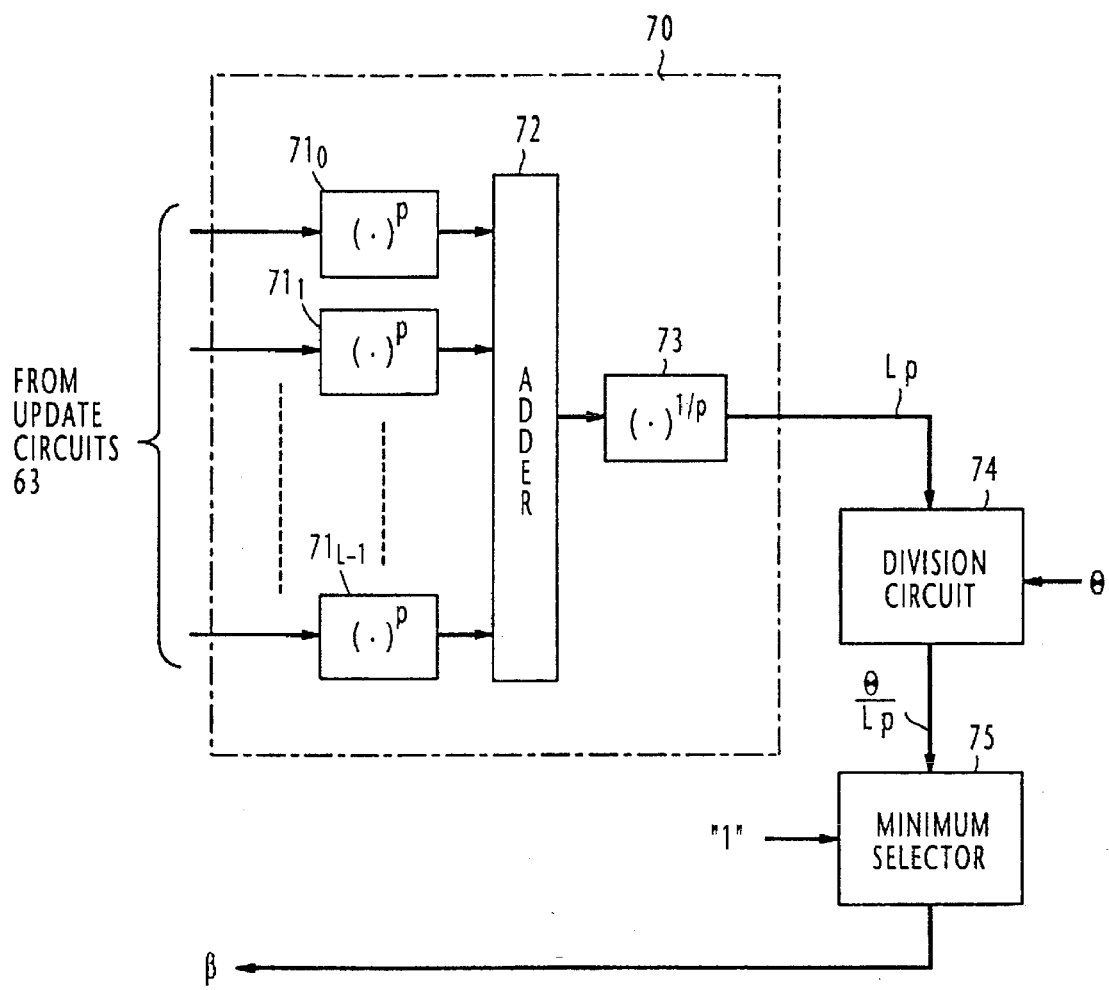
FIG. 7 is a block diagram of the constraint coefficient generator used in FIG. 6.

As shown in detail in FIG. 7, the constraint coefficient generator 69 includes a calculator 70 for calculating the p-th power of norms. This calculator is formed by a plurality of circuits $71_0$~$71_{L-1}$ for raising the corresponding outputs of the update circuits 63 to the p-th power. The outputs of the p-th power-raising circuits 71 are summed by an adder 72 and supplied to a circuit 73 where an Lp value is obtained by taking the inverse root of p-th power of the output of adder 72. The value Lp is supplied to a division circuit 74 where it is used to divide the threshold value Θ. The output of the division circuit 74 is fed to a minimum selector 75 which compares it with the unity value and selects the smaller of the two and supplies it as a constraint control parameter β to all the update circuits 63. When the Lp value exceeds the constant Θ, all the tap weight values are decreased so that Lp becomes smaller than Θ.

Figure 8:
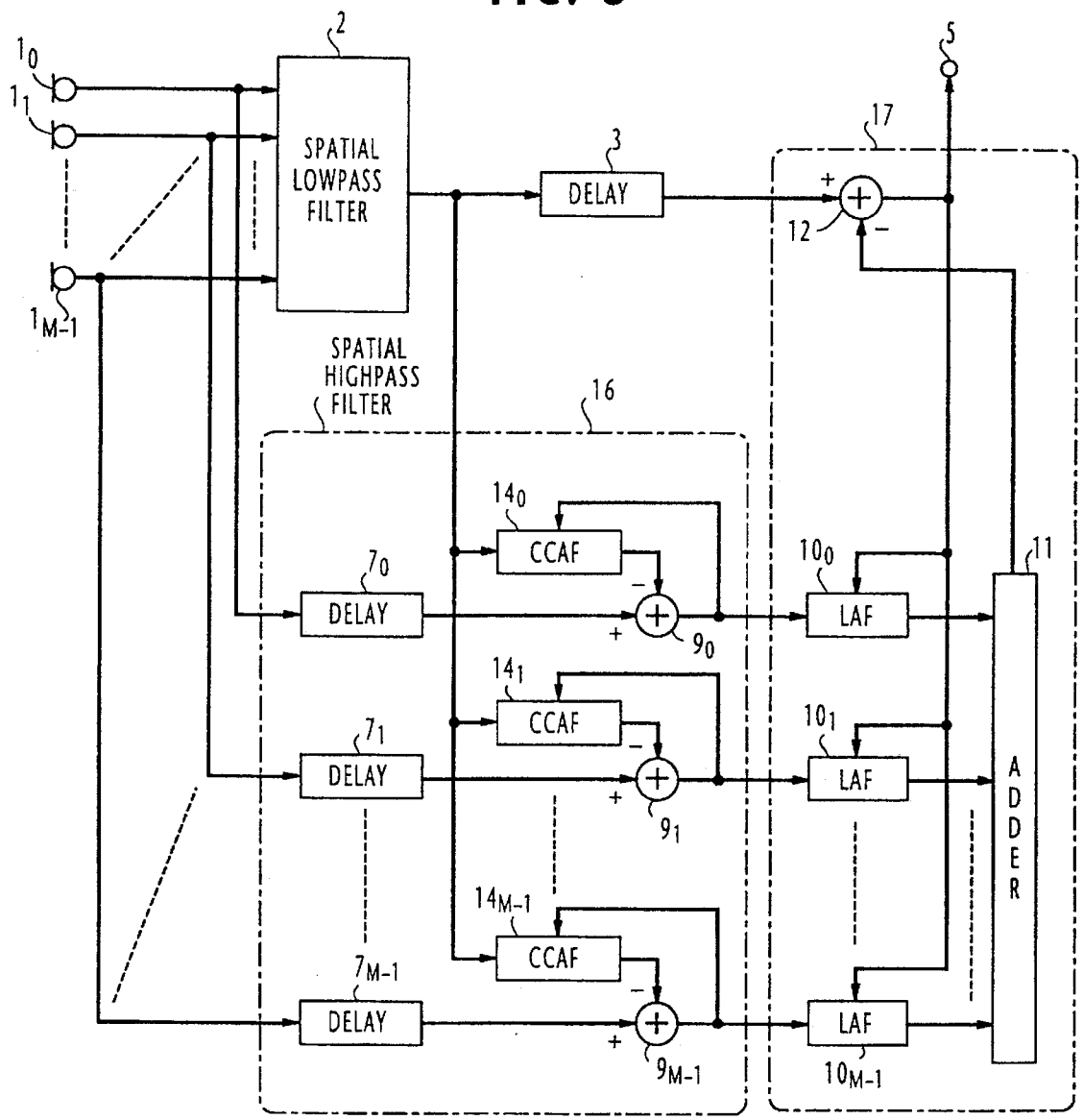
FIG. 8 is a block diagram of an adaptive array beamformer according to a third embodiment of the present invention.
Figure 9:
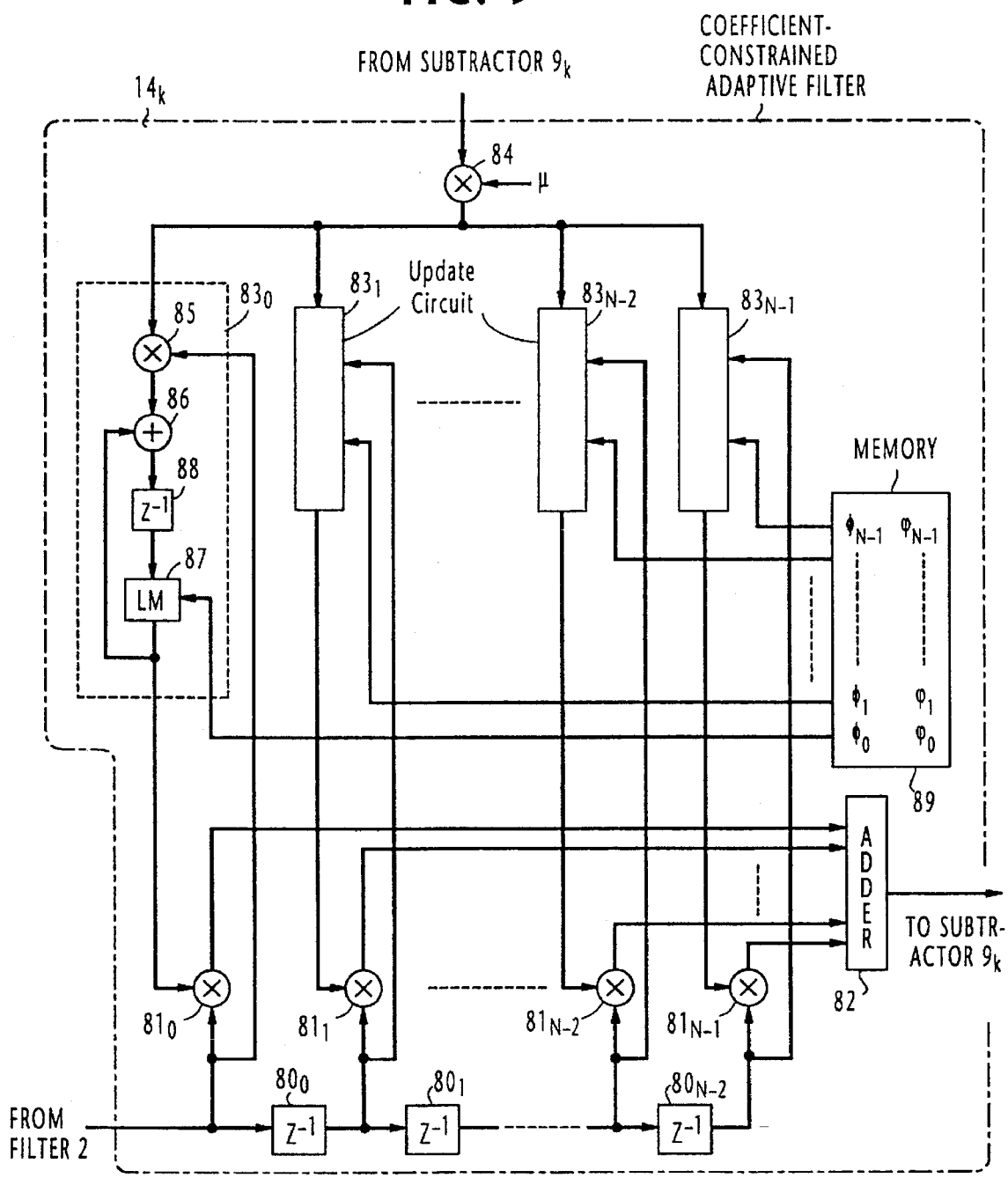
FIG. 9 is a block diagram of the coefficient-constrained adaptive filters of the third embodiment.

A third embodiment of the present invention is shown in FIG. 8 which is a further modification of the first embodiment. In this modification, a coefficient-constrained adaptive filter 14 is used instead of each leaky adaptive filter 8 of FIG. 4. As illustrated in detail in FIG. 9, each coefficient-constrained adaptive filter 14 has a memory 89 in which maximum tap weight values $\phi_0$~$\phi_{N-1}$ and minimum weight values $\phi_0$~$\phi_{N-1}$ are stored for update circuits 83. The reference signal from spatial lowpass filter 2 successively appears as tap signals along taps formed by delay elements 80 and multiplied in corresponding multipliers 81 with a tap weight coefficient supplied from corresponding update circuits 83 and summed by adder 82 where it is coupled to the corresponding subtractor 9. The output of this subtractor 9 is weighted by the stepsize μ in multiplier 84 and supplied to multiplier 85 where it is multiplied with the corresponding tap signal, the output of multiplier 85 being summed in adder 86 with a previous tap weight value form a limiter 87 and supplied through delay element 88 to the limiter 87.

Figure 10:
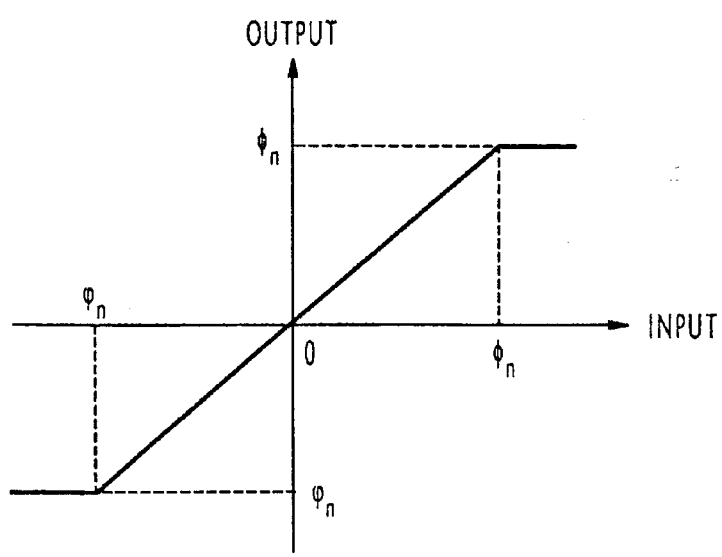
FIG. 10 is a graphic representation of the input/output characteristic of the limiters of FIG. 9.

Corresponding maximum and minimum tap weight values $\phi_i$ and φi (i=0, 1, . . . N−1) form a pair and each maximum/minimum pair is supplied to corresponding update circuit $83_i$ from memory 89. As illustrated graphically in FIG. 10, the limiter 87 of each update circuit has a linear input/output characteristic for input values varying in the range between $\phi_n$ and $\phi_n$ and a flat characteristic outside the range. The output of the limiter 87 varies linearly with its input as long as it is within the limit values and clamped to one of the limit values when the input falls outside of the range.

Figure 11:
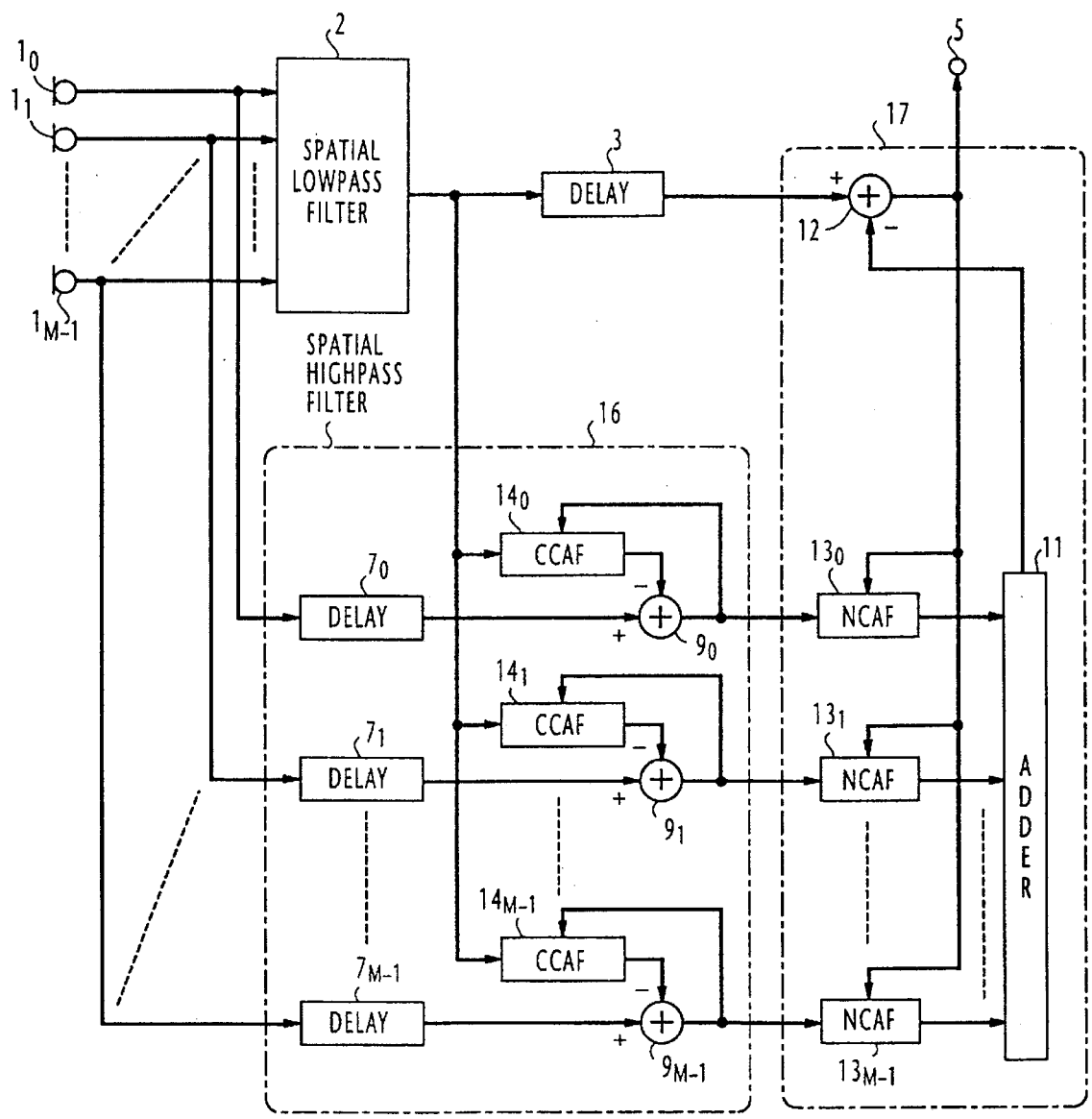
FIG. 11 is a block diagram of an adaptive array beamformer according to a fourth embodiment of the present invention.

As shown in FIG. 11, a fourth embodiment of the present invention is implemented by the combination of the norm-constrained adaptive filters 13 of FIG. 5 and the coefficient-constrained adaptive filters 14 of FIG. 8.

Figure 12:
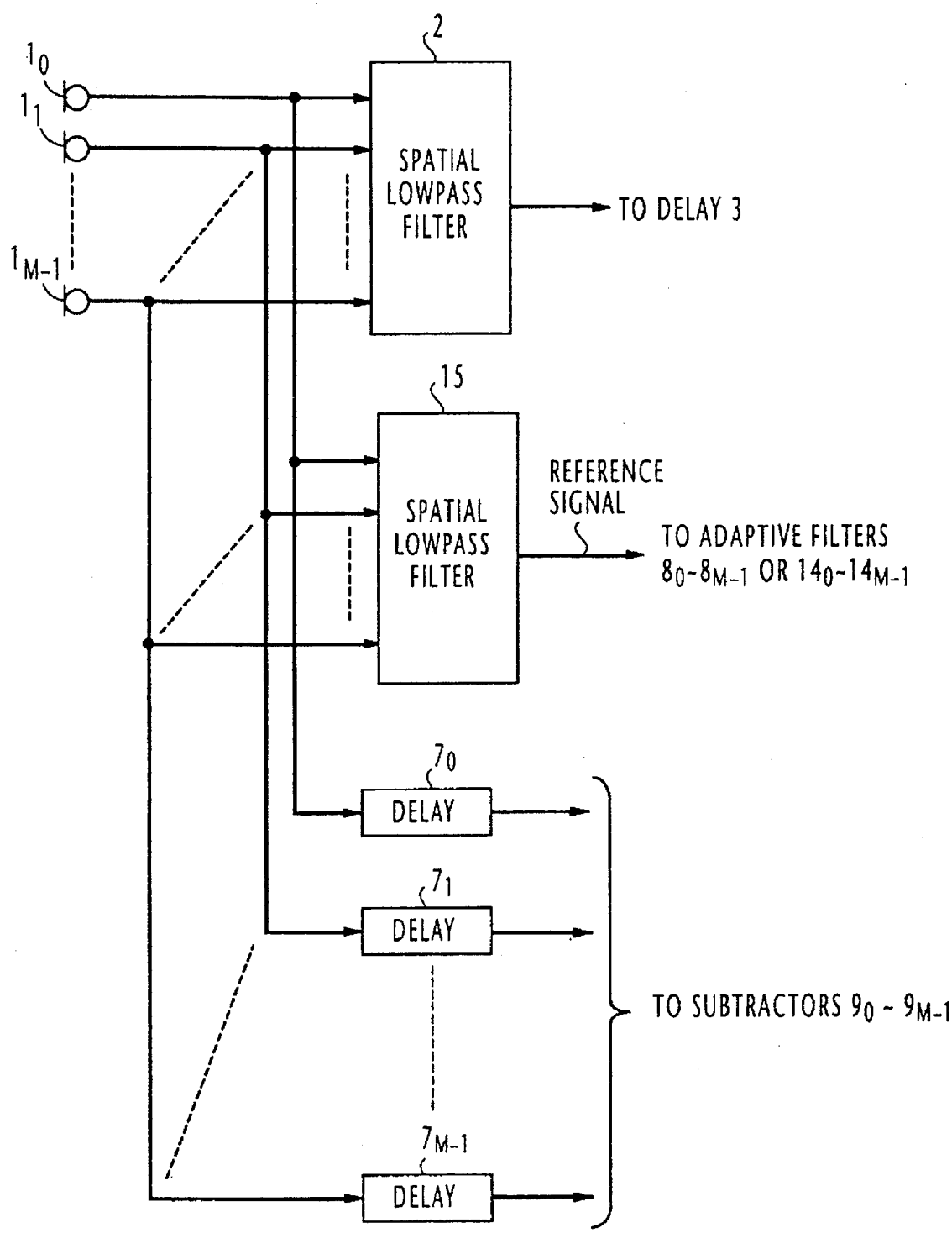
FIG. 12 is a block diagram of a modification of the present invention.

A second spatial lowpass filter 15 may be provided as shown in FIG. 12. This second filter is connected to the microphone array to produce a signal which can be used as a reference signal, instead of using the output of the first spatial lowpass filter 2, for the leaky adaptive filters 8 as well as for the coefficient-constrained adaptive filters 14 of the previous embodiments. In this embodiment, the first spatial lowpass filter 2 is designed to form a mainlobe of greater width in the assumed direction in comparison with the width of the mainlobe formed by spatial lowpass filter 15. With the wider mainlobe of the first spatial lowpass filter 2, the overall characteristic of the beamformer is fit to the characteristic of this filter. This arrangement is particularly useful when there is a large look-direction error.

What is claimed is:

1. An adaptive array beamformer comprising:

an array of spatially distributed sensors;

a spatial beamforming filter connected to said sensors for respectively filtering output signals of the sensors and summing the filtered output signals to produce a first filter output containing a target signal arriving at said array in a specified direction;

a plurality of first adaptive filters, each having a tapped-delay line connected to receive said first filter output, coefficient update means for producing tap weight coefficients indicating correlations between tap signals from the tapped-delay line and a first error signal applied thereto, a multiply-and-sum circuit for weighting said tap signals with said coefficients respectively and summing the weighted tap signals to produce a second filter output not containing said target signal, said coefficient update means including restraining means for preventing said coefficients from increasing indefinitely;

a plurality of first subtractors, each detecting a difference between an output signal of a corresponding one of said sensors and the second filter output of a corresponding one of said first adaptive filters and supplying the difference to the coefficient update means of the corresponding first adaptive filter as said first error signal;

a plurality of second adaptive filters, each having a tapped-delay line connected to receive said first error signal from a corresponding one of said first subtractors, coefficient update means for producing tap weight coefficients indicating correlations between tap signals from the tapped-delay line and a second error signal applied thereto, a multiply-and-sum circuit for weighting said tap signals with said coefficients respectively and summing the weighted tap signals to produce a third filter output, said coefficient update means including restraining means for preventing said coefficients from increasing indefinitely;

an adder for summing the third filter outputs from the second adaptive filters; and a second subtractor for detecting a difference between the first filter output and a summed signal from said adder and supplying the difference to the coefficient update means of said second adaptive filters as said second error signal.

2. An adaptive array beamformer comprising:

an array of spatially distributed sensors;

a first spatial beamforming filter connected to said sensors for respectively filtering output signals of the sensors and summing the filtered output signals to produce a first filter output containing a target signal arriving at said array in a specified direction;

a second spatial beamforming filter connected to said sensors for respectively filtering output signals of the sensors and summing the filtered output signals to produce a second filter output containing said target signal, said second spatial beamforming filter having a greater beam width than a beam width of the first spatial beamforming filter;

a plurality of first adaptive filters, each having a tapped-delay line connected to receive said second filter output coefficient update means for producing tap weight coefficients indicating correlations between tap signals form the tapped-delay line and a first error signal applied thereto, a multiply-and-sum circuit for weighting said tap signals with said coefficients respectively and summing the weighted tap signals to produce a third filter output not containing said target signal, said coefficient update means including restraining means for preventing said coefficients from increasing indefinitely;

a plurality of first subtractors, each detecting a difference between an output signal of a corresponding one of said sensors and the third filter output of a corresponding one of said first adaptive filters and supplying the difference to the coefficient update means of the corresponding first adaptive filter as said first error signal;

a plurality of second adaptive filters, each having a tapped-delay line connected to receive said first error signal from a corresponding one of said first subtractors, coefficient update means for producing a tap weight coefficients indicating correlations between tap signals from the tapped-delay line and a second error signal applied thereto, a multiply-and-sum circuit for weighting said tap signals with said coefficients respectively and summing the weighted tap signals to produce a fourth filter output, said coefficient update means including restraining means for preventing said coefficients from increasing indefinitely;

an adder for summing the third filter outputs from the second adaptive filters; and a second subtractor for detecting a difference between the first filter output and a summed signal from said adder and supplying the difference to the coefficient update means of said second adaptive filters as said second error signal.

3. An adaptive array beamformer as claimed in claim 1 or 2, wherein the restraining means of said first adaptive filters comprises a leaky integrator.

4. An adaptive array beamformer as claimed in claim 1 or 2, wherein the restraining means of said first adaptive filters comprises a limiter having a linear input/output characteristic between predetermined maximum and minimum values.

5. An adaptive array beamformer as claimed in claim 1 or 2, wherein the restraining means of said second adaptive filters comprises a leaky integrator.

6. An adaptive array beamformer as claimed in claim 1 or 2, wherein the restraining means of said second adaptive filters comprises a norm constraining means.

7. An adaptive array beamformer as claimed in claim 3, wherein the restraining means of said second adaptive filters comprises a leaky integrator.

8. An adaptive array beamformer as claimed in claim 4, wherein the restraining means of said second adaptive filters comprises a leaky integrator.

9. An adaptive array beamformer as claimed in claim 3, wherein the restraining means of said second adaptive filters comprises a norm constraining means.

10. An adaptive array beamformer as claimed in claim 4, wherein the restraining means of said second adaptive filters comprises a norm constraining means.

* * * * *